United States Patent

Chang et al.

[11] Patent Number: 5,923,393
[45] Date of Patent: Jul. 13, 1999

[54] LIQUID CRYSTAL DISPLAY

[75] Inventors: C. C. Chang; Kay Pui Ho, both of Kowloon, The Hong Kong Special Administrative Region of the People's Republic of China

[73] Assignees: Varintelligent (BVI) Limited, Virgin Islands (Br.); Terrence Leslie Johnson, London, United Kingdom

[21] Appl. No.: 08/755,090

[22] Filed: Nov. 22, 1996

[30] Foreign Application Priority Data

Nov. 24, 1995 [GB] United Kingdom ............... 9524113

[51] Int. Cl.$^6$ .................. G02F 1/1345; G09G 5/00; H01R 4/66; H05K 1/00

[52] U.S. Cl. ............. 349/151; 349/149; 349/15 D; 345/206; 439/66; 361/748

[58] Field of Search .................. 349/150, 151, 349/152, 149; 345/206, 207; 439/66; 361/748, 749, 760

[56] References Cited

U.S. PATENT DOCUMENTS

| | | |
|---|---|---|
| 4,598,337 | 7/1986 | Wuthrich et al. . |
| 4,644,338 | 2/1987 | Aoki et al. ............................. 349/151 |
| 4,655,551 | 4/1987 | Washizuka et al. ................... 349/150 |
| 5,007,841 | 4/1991 | Smolley ................................ 439/66 |
| 5,130,833 | 7/1992 | Mase ..................................... 359/83 |
| 5,161,009 | 11/1992 | Tanoi et al. ......................... 349/150 |
| 5,162,613 | 11/1992 | Schoenthaler ......................... 439/66 |
| 5,193,022 | 3/1993 | Hirai .................................... 349/150 |
| 5,212,576 | 5/1993 | Yoshioka ............................. 349/150 |
| 5,358,412 | 10/1994 | Maurinus et al. .................... 349/152 |
| 5,442,470 | 8/1995 | Hashimoto ............................ 359/83 |
| 5,670,994 | 9/1997 | Kawaguchi et al. ................. 349/150 |
| 5,737,052 | 4/1998 | Kimura et al. ...................... 349/151 |
| 5,737,272 | 4/1998 | Uchiyama et al. .................. 349/150 |

FOREIGN PATENT DOCUMENTS

| | | |
|---|---|---|
| 0568392A2 | 4/1993 | European Pat. Off. . |
| 6-202136 | 7/1994 | Japan ................................. 349/151 |
| 2130794 | 6/1984 | United Kingdom . |
| 2189084 | 10/1987 | United Kingdom . |
| 2204184 | 11/1988 | United Kingdom . |

*Primary Examiner*—Huy Mai
*Assistant Examiner*—Toan Ton
*Attorney, Agent, or Firm*—Wood, Phillips, VanSanten, Clark & Mortimer

[57] ABSTRACT

A method of making a combined printed circuit board having a hollow portion or a through hole and an integrated circuit driver, wherein an external surface of the board and the driver is substantially planar. The method comprises steps of mounting the driver in the hollow portion, providing means temporarily for holding the driver in the hollow portion, encapsulating resin the driver with resin, and then removing the temporarily holding means.

9 Claims, 4 Drawing Sheets

LIQUID CRYSTAL DISPLAY

The invention relates to a liquid crystal display, and particularly to such a display with a driver, suitably an integrated circuit driver (IC).

Chip on glass (COG) and tape automated bonding (TAB) are known for production of liquid crystal display (LCD) assemblies.

A COG assembly uses specially created IC chips in which output pads are in the form of "bumps". These "bumps" are usually of Al or Au, and are bonded directly onto the display glass using a suitable adhesive.

A TAB LCD assembly has an IC chip with "bumps" bonded onto a relatively thin backing tape or film made usually of plastic.

The tape is etched with suitable tracks and connection pads akin to a printed circuit board, the connection pads with the IC being bonded with corresponding pads on the glass using suitable adhesives.

Such assemblies have the disadvantage that the IC can be damaged or knocked off, while an additional circuit is required in order to provide a sensible operative assembly. This results in a bulky and extensive assembly. Another way, therefore, is to provide an LCD assembly with a printed circuit board (PCB), but these, while being more robust than the COG or TAB are generally much bulkier than the TAB for example, resulting in a bulky assembly that cannot readily be used in small items of apparatus.

It is accordingly an object of the invention to seek to mitigate this disadvantage.

According to a first aspect of the invention, there is provided a combined printed circuit board and integrated circuit driver, wherein an external surface of the board and driver is substantially planar. This provides a smooth apparatus having a thickness no greater than that of the PCB.

The board may comprise a hollow portion in which the driver is mounted. This provides an efficient way of achieving a thin construction, particularly where the hollow portion may provide a through hole in which the driver is mounted.

According to a second aspect of the invention there is provided a method of making apparatus as hereinbefore defined, comprising providing a printed circuit board, providing a through hole therethrough, providing an integrated circuit driver, mounting the driver in the hole, providing means temporarily to hold the chip in the hole, bonding the chip with the board, encapsulating the chip with resin, and then removing the holding means.

The holding means may comprise an adhesive tape. This is a relatively simple way of providing means to hold the IC.

There may be the step of earthing (grounding) the driver to the board on the planar surface opposite a surface on which the holding means is mounted. This simplifies the manufacturing method.

According to a yet further aspect of the invention there is provided a device comprising a liquid crystal display (LCD), a printed circuit board and an integrated circuit driver carried thereby, the printed circuit board and driver having a thickness which does not exceed the overall thickness of the LCD.

The external surface of the printed circuit board and driver may be substantially planar.

There may be a display layer supporting the liquid crystal display and the printed circuit board and driver combination.

The display layer may comprise a glass layer, and suitably the printed circuit board may extend beyond a part of the glass layer projecting beyond the LCD. This latter construction uses less glass.

Apparatus embodying the invention is hereinafter described, by way of example, with reference to the accompanying drawings.

Figure 1:
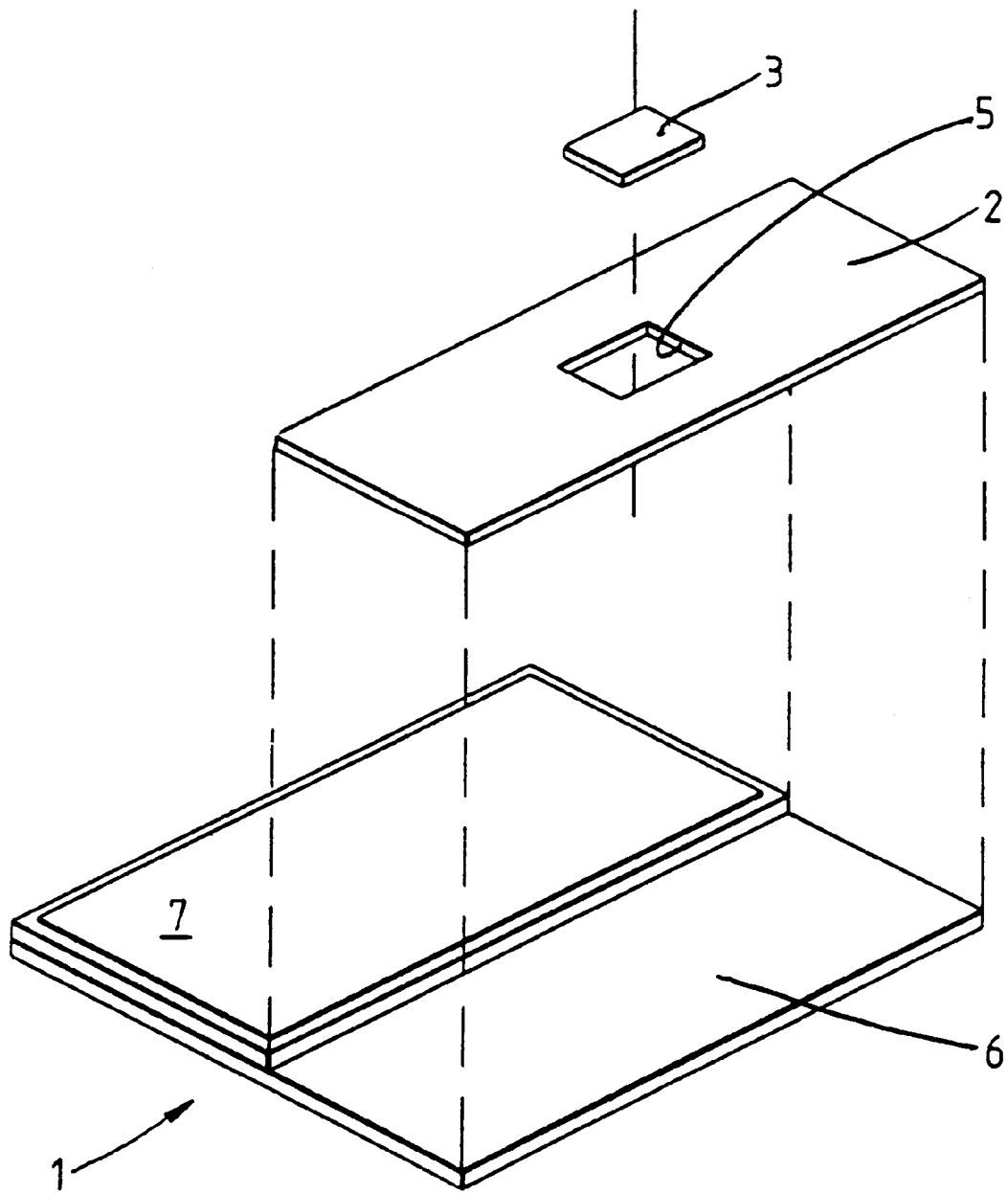
FIG. 1 is an exploded perspective view of one embodiment of apparatus according to the invention.
Figure 2:
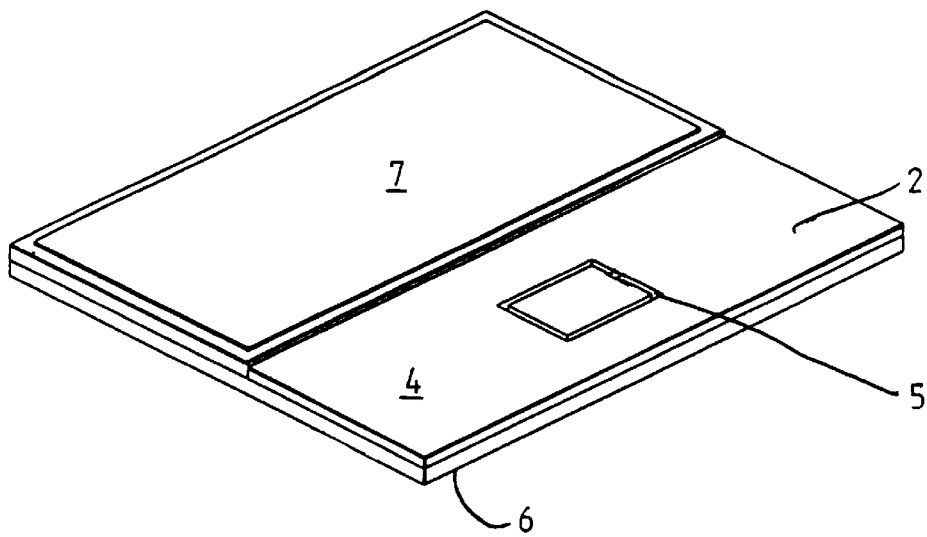
FIG. 2 is a perspective view of an assembled apparatus of FIG. 1.

Referring to the drawings in which like parts are referred to by like numerals, there is shown apparatus 1 comprising a combined printed circuit board 2 and integrated circuit driver 3, wherein an external surface 4 of the board and driver is substantially planar.

The planar nature of the surface 4, the upper surface, as viewed in the drawings, is achieved by providing a hollow part or recess, in the embodiment a through hole 5, in the printed circuit board 2. The IC driver 3 has an external configuration complementary to the configuration of the through hole 5, and the thickness of the board 2 and IC driver 3 are in the embodiments identical.

This means that when the IC driver 3 is inserted at mounted in the hole 5, and secured in place, the whole assembly is only of the thickness of the PCB 2, which moreover has essentially a planar surface. Thus when the apparatus 1 is mounted on a display support or glass 6 of an LCD 7, the overall thickness of the assembly of LCD 7, PCB 2 and IC driver 3 is thin, and basically does not exceed the overall thickness of the LCD 7. Thus, the thin assembly can be used to provide displays for small items such as mobile telephones and pagers, which means that such items can be made smaller, and lighter, and more compact then hitherto.

Figure 3:
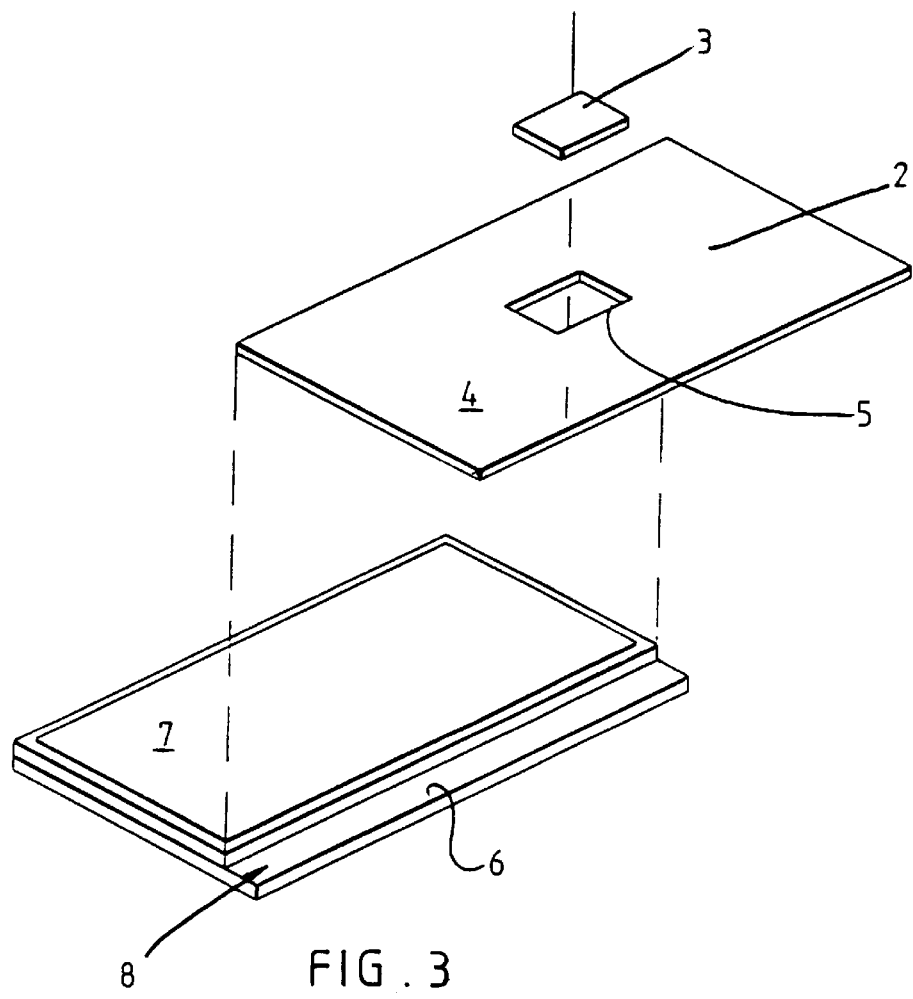
FIG. 3 is an exploded perspective view of a second embodiment of apparatus according to the invention.
Figure 4:
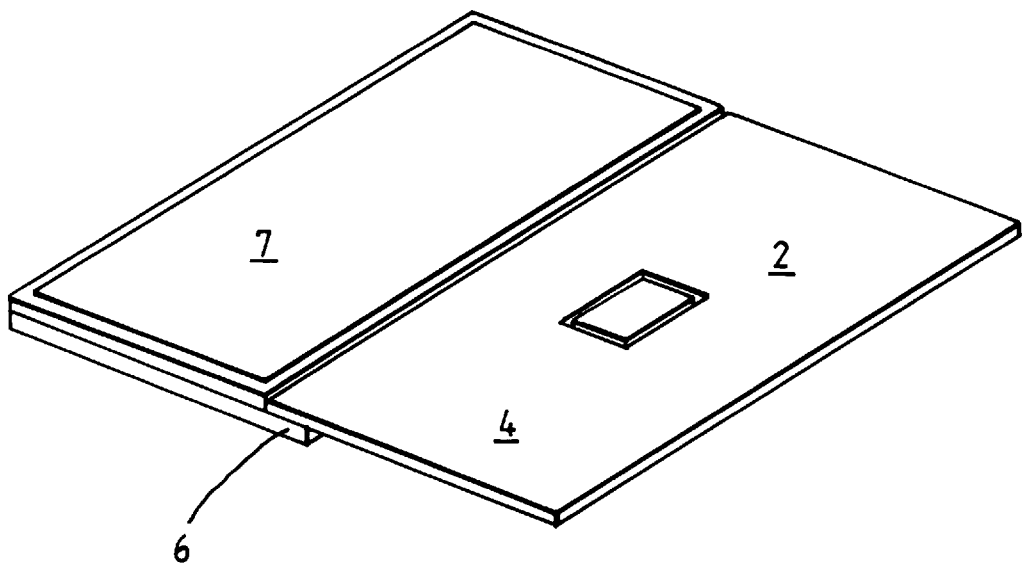
FIG. 4 is a perspective view of an assembled apparatus of FIG. 4.

In FIGS. 3 and 4, the display glass 6 only just extends beyond the LCD 7, the extension 8 being sufficient to provide a support for the PCB/IC driver combination, thereby saving on glass.

Figure 5:
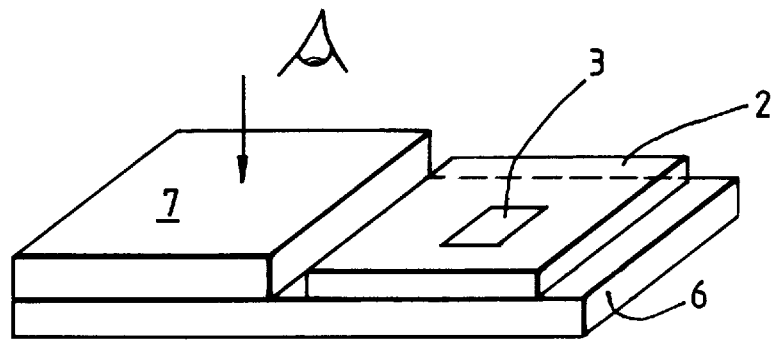
FIGS. 5 and 6 are respectively further embodiments of apparatus according to the invention.
Figure 6:
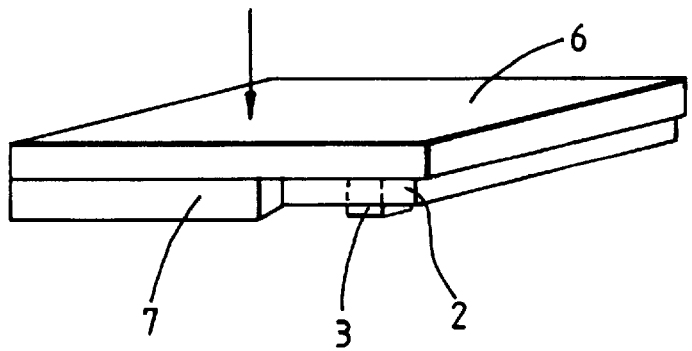
Figure 7:
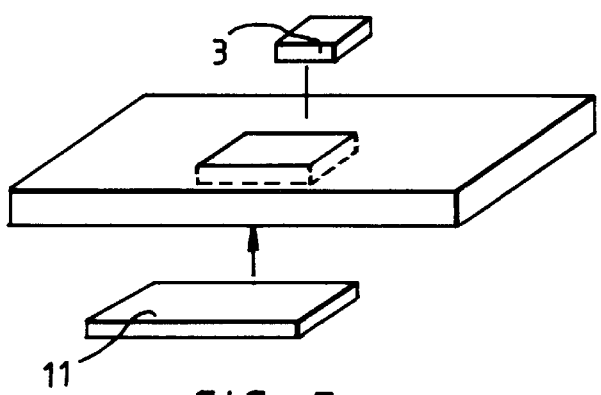
FIG. 7 is a schematic perspective view of a method of making apparatus embodying the invention.

As will be understood from FIGS. 5 and 6, an LCD assembly utilising the invention may be viewed from the side opposite the display glass 6, or through the display glass 6 (FIG. 6).

Figure 9:
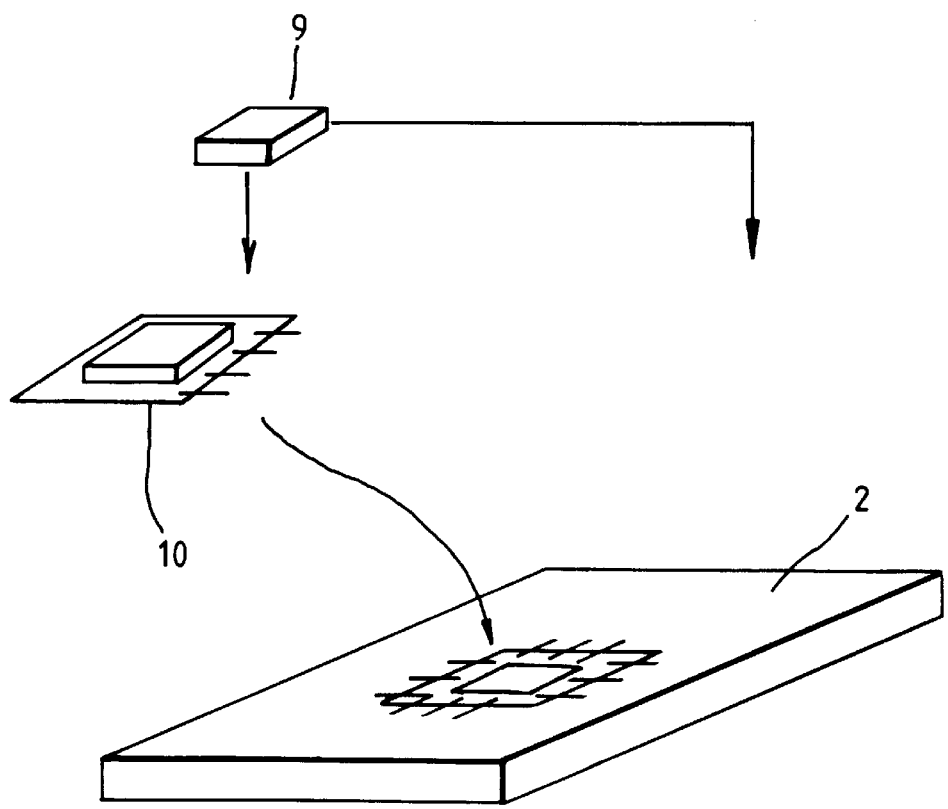
FIG. 9 is another embodiment in schematic perspective view.

FIG. 9 illustrates schematically an embodiment whereby a COG 9 or a TAB 10 instruction can itself be mounted in a hole 5 in a PCB 7, again to provide an assembly of thickness which is that of the PCB itself.

It will, however, be understood that an advantage of the embodiments shown is the PCB and IC driver assembly can be tested before bonding to the display glass. In prior art situations such as the COG, if the IC driver chip is faulty, the whole unit, including the LCD, has to be written off.

Figure 8:
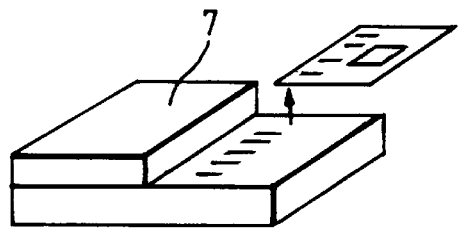
FIG. 8 shows a schematic perspective view of a further embodiment.

To make an assembly, the PCB is prepared with its through hole 5, an adhesive tape 11 is placed over the underside of the hole 5, the IC chip 3 is mounted in the hole, is encapsulated with epoxy resin, and the tape is then removed, leaving the flush mounting of the IC driver in the PCB. This is possible as the IC driver is earthed on the upper side of the PCB. The assembly of PCB and IC driver is mounted on the display glass using an anisotropy conductive film (FIG. 8).

We claim:

1. A method of making a combined printed circuit board and integrated circuit driver, wherein an external surface of the board and driver is substantially planar, the method comprising:

providing a printed circuit board, providing a hollow portion in the printed circuit board, providing an integrated circuit driver, mounting the integrated circuit driver in the hollow portion, providing means temporarily to hold the integrated circuit driver in the hollow portion, encapsulating the integrated circuit driver with resin, and then removing the holding means.

2. A method according to claim 1, wherein the hollow portion comprises a through hole in which the driver is mounted.

3. A method according to claim 1, wherein the holding means comprises adhesive tape.

4. A method according to claim 1 further comprising the step of earthing (grounding) the integrated circuit driver to the board on the planar surface opposite a surface on which the holding means is mounted.

5. A product made according to the method of claim 1 comprising a liquid crystal display (LCD), a printed circuit board and an integrated circuit driver carried thereby, the printed circuit board and driver having a thickness which does not exceed the overall thickness of the LCD.

6. A product according to claim 5, wherein the external surface of the printed circuit board and driver are substantially planar.

7. A product according to claim 6, comprising a display layer supporting the liquid crystal display and the printed circuit board and driver combination.

8. A product according to claim 7, wherein the display layer comprising a display glass.

9. A product according to claim 8, wherein the printed circuit board extends beyond a part of the display glass projecting beyond the LCD.

* * * * *